United States Patent [19]
George

[11] 3,984,705
[45] Oct. 5, 1976

[54] HIGH POWER REMOTE CONTROL ULTRASONIC TRANSMITTER

[75] Inventor: John Barrett George, Indianapolis, Ind.

[73] Assignee: RCA Corporation, New York, N.Y.

[22] Filed: May 23, 1975

[21] Appl. No.: 580,679

[52] U.S. Cl. .................................. 310/8.1; 318/116
[51] Int. Cl.[2] .......................................... H01L 41/04
[58] Field of Search ................ 310/8, 8.1; 318/116, 318/118; 331/57, 73, 116 R, 116 M, 117 R, 139, 140, 151, 152, 155, 158, 167, 169–171; 343/225–228; 340/147 F, 164 A, 164 B, 164 R, 171 R, 384 E

[56] References Cited

UNITED STATES PATENTS 3,568,074 3/1971 Carroll .......................... 340/171 X
3,681,626 8/1972 Puskas .............................. 310/8.1
3,727,112 4/1973 Popescu ......................... 310/8.1 X

*Primary Examiner*—Mark O. Budd
*Attorney, Agent, or Firm*—Eugene M. Whitacre; Peter M. Emanuel

[57] ABSTRACT

A wide bandwidth, high gain ultrasonic frequency transducer drive circuit utilizes a relatively low voltage source of supply voltage. A first signal path from a source of drive signals includes circuitry resonant with the transducer for providing a relatively high signal voltage across this transducer. A second signal path from the source of drive signals includes a resonant circuit mutually coupled to the first resonant circuit for inducing signal energy into the first path and increasing the signal voltage across the transducer.

4 Claims, 4 Drawing Figures

HIGH POWER REMOTE CONTROL ULTRASONIC TRANSMITTER

Figure 1:
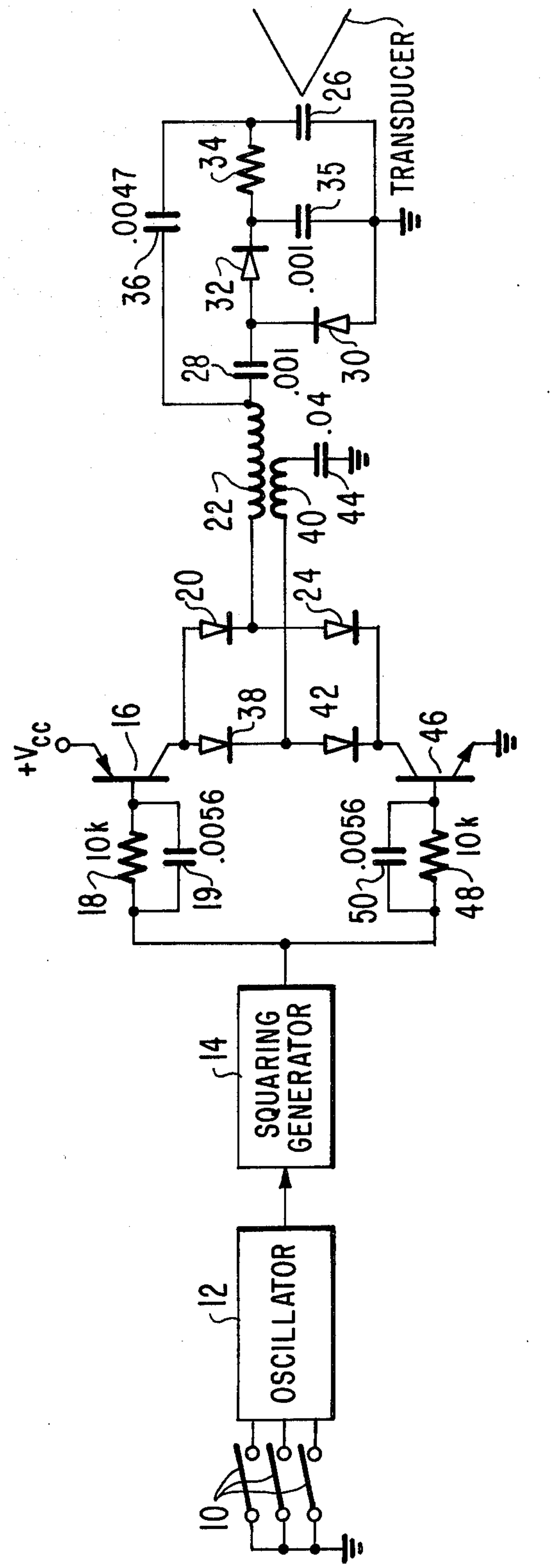

This invention relates to ultrasonic remote control transmitters and more particularly to an ultrasonic transducer drive circuit having broad bandwidth and low power dissipation.

Remote control of, for example, television receivers is generally accomplished by utilizing a small hand-held transmitter for transmitting control signals to a remote control receiver located within a television receiver cabinet. The remote control transmitter may include a plurality of push buttons for effecting transmission of appropriate signals on, for example, a respective plurality of ultrasonic frequencies for which the remote control receiver is responsive. Control functions such as channel change, volume up and down, color up and down, tint and brightness may be controlled by ones of these push buttons. In one type of system, depression of each of the plurality of transmitter push buttons causes the transmitter to transmit a different frequency. Hence, if there are ten functions to be controlled, the transmitter provides output signals on ten separate frequencies. Generally, the frequencies provided by the transmitter are within the ultrasonic frequency range of about 20 to 55 KHz. As a result of this relatively wide frequency range of signal transmission, the transmitter generally utilizes an ultrasonic transducer having a similarly broad bandwidth. Transducers having a relatively broad bandwidth generally have a relatively low gain unless made resonant at each of the transmitted frequencies. The transducer may be made resonant at each of the transmitted frequencies by switching appropriate capacitors into the associated resonant circuit. This latter method is undesirable, however, in that it requires precisely tuned circuits to maintain high transducer output on each of the transmitted frequencies. To this end, it is desirable to use a transducer circuit that is tuned to a single frequency for all frequency transmission.

High power remote control transmitters that do not utilize a transducer drive circuit resonant at the transmission frequency generally require a correspondingly high battery voltage in order to provide output signals of sufficient potential difference to adequately drive, for example, a capacitive transducer. It is desirable, however, to provide transmitter circuitry which incorporates a battery voltage which may be readily obtained from commonly available battery sources. One type of battery source that is particularly desirable for remote control transmitter use is the RCA type VS-323 9-volt battery which is readily available from, for example, most radio supply stores. A 9-volt peak-to-peak signal applied to a capacitive type of transducer, however, produces an inadequate pressure head of ultrasonic signal energy at the output of this transducer over the desired frequency range noted above. A desirable amount of signal pressure output is provided from a transducer when a relatively large peak-to-peak voltage signal is applied to the transducer inputs.

Apparatus that provides a relatively large peak-to-peak signal to an associated transducer from a relatively low voltage supply source comprises an oscillator for generating ultrasonic frequency signals. A signal squaring means is coupled to this oscillator and provides signals at substantially first and second voltage states. A first current conducting means is coupled to this squaring means and is responsive to signals of a first voltage state for providing current flow to the capacitive type of transducer. A second current conducting means is also coupled to the squaring means and is responsive to signals of the second voltage state for causing current to flow from the transducer. A first inductor is coupled between the transducer and the first and second current conducting means. This first inductor is tuned with respect to the capacitance of the transducer to a frequency that is greater than any signal frequency provided by the aforementioned oscillator. A second inductor, which is also receptive to signals from the first and second current conducting means, is resonant at a frequency greater than the resonant frequency of the first inductor and transducer capacitance and operates to couple signal energy to the first inductor for increasing the signal voltage applied to the transducer.

Figure 2A:
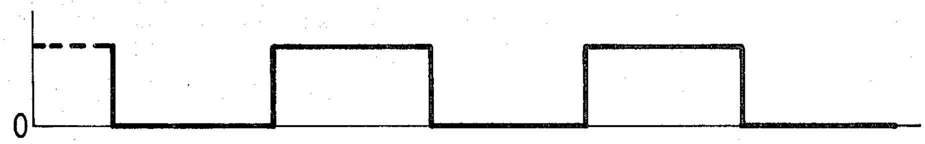
Figure 2B:
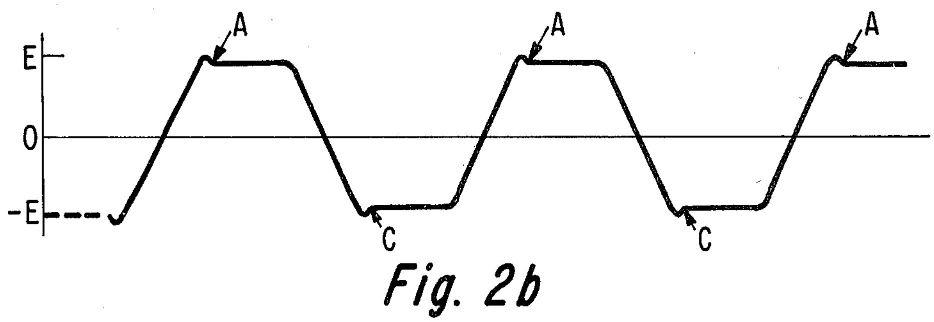
Figure 2C:
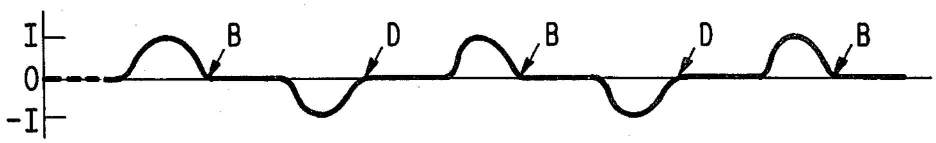

A better understanding of the present invention may be derived with reference to the following description when taken with the drawing in which:

FIG. 1 is a partial block and schematic diagram of an ultrasonic transmitter circuit incorporating the present invention; and FIGS. 2*a* – 2*c* illustrate waveforms associated with the apparatus in FIG. 1.

With reference to FIG. 1, there is shown a series of switches 10 coupled to an oscillator 12, each switch being associated with a different transmission frequency. Signals provided by oscillator 12 are coupled to a squaring generator 14 which, in turn, provides signals through a first path to a transistor 16. A parallel combination of resistor 18 and capacitor 19 are interposed between the base electrode of transistor 16 and an output terminal of generator 14. A diode 20 has an anode electrode coupled to a collector electrode of transistor 16 and a cathode electrode coupled to an inductor 22 and to an anode of a second diode 24. A capacitive type of transducer 26 receives signals provided through inductor 22 via a voltage doubling biasing circuit. This voltage doubler is comprised of a series capacitor 28 in shunt with a diode 30, a series diode 32 in shunt with a capacitor 35 and a series resistor 34 coupled to transducer 26. A signal coupling capacitor 36 is coupled from transducer 26 to the junction of capacitor 28 and inductor 22.

A diode 38 has an anode electrode coupled to the collector electrode of transistor 16 and a cathode electrode coupled to an inductor 40 and to the anode electrode of a diode 42. Inductor 40 is further coupled to ground through a capacitor 44.

Signals provided by generator 14 are further coupled through a second path to a transistor 46. A parallel combination of resistor 48 and capacitor 50 is interposed between the base electrode of transistor 46 and the output terminal of generator 14. The collector electrode of transistor 46 is coupled to the respective cathode electrodes of the aforementioned diodes 24 and 42.

In the operation of the above-described circuit, a selected one of switches 10 is depressed to cause transmission of remote control signals by the apparatus of FIG. 1 to an associated remote control receiver (not shown). Although three push buttons are illustrated for switches 10, it will be appreciated that any number of switches corresponding to a desired number of remote control functions may be utilized. It should also be appreciated that other oscillator arrangements, for example, digitally signal encoded arrangements may be utilized.

Signals provided at the output of oscillator 12 may be in the range of, for example, 20 KHz to 55 KHz. These signals are coupled to a squaring generator 14 wherein the signals are converted to bi-level or square wave type signals. Generator 14 may comprise a series of high gain amplifier stages wherein applied, substantially sinusoidal input signals from oscillator 12 are converted to signals having levels corresponding to a saturated state and a cutoff state of the final amplifier stage (see FIG. 2*a*). The signals provided by generator 14 are coupled to the base electrode of PNP type transistor 16 via resistor 18 and capacitor 19 and to the base electrode of NPN transistor 46 via resistor 48 and capacitor 50.

Transistor 16 conducts and transistor 46 is cut off when the applied input signal from generator 14 changes from a high state (i.e., positive voltage) to a low state (for example, 0 volts). Conduction in transistor 16 causes current to flow from the supply source $+V_{cc}$ through diodes 20 and 38 and through the associated inductors 22 and 40. Signal energy passing through inductor 22 is coupled through a first path of capacitors 28 and 36 to transducer capacitors 26, and through a second path of diodes 30 and 32, resistor 34 and capacitors 28 and 35. The second path, including diodes 30 and 32 and capacitor 35, forms a voltage doubling circuit which converts a portion of the signal energy from generator 14 into a DC bias voltage. The DC voltage developed across capacitor 35 operates to provide a bias voltage to transducer 26. A bias voltage across transducer 26 is desirable to conform with the best mode of operation of such a device.

Capacitor 36 is arranged to be approximately five hundred times larger than capacitor 26 in order to assure transfer of the signal energy through capacitor 36 to transducer 26. Signal energy coupled through capacitor 36 modulates the bias voltage developed across transducer 26. An isolating resistor 34, which is interposed between the voltage doubler and transducer 26 operates to isolate the signal energy from the bias voltage developed across capacitor 35. During the interval when the signal provided by generator 14 is low, capacitor 26 is caused to charge to a positive potential. In order to assure that capacitor 26 reaches a maximum charge within a half-cycle of the applied signal from generator 14, the resonant frequency of inductor 22 and capacitor 26 is adjusted to be higher than the highest frequency provided by oscillator 12. FIG. 2*b* illustrates the change in voltage across capacitor 26 in response to the generator 14 output signal illustrated in FIG. 2*a*. Upon capacitor 26 reaching a maximum charge, the LC circuit comprised of capacitor 26 and inductor 22 begins to ring. As the ringing begins, the voltage across capacitor 26 begins to diminish, and the resultant current flow reverses (see "A" in FIG. 2*b*). FIG. 2*c* illustrates the current flow of capacitor 26. As the current reverses, diode 20 becomes back-biased inhibiting any further current flow therethrough (see "B" in FIG. 2*c*). Current does not flow through diode 24 at this time since transistor 46 is biased-off during a low half-cycle of input signal from generator 14. Hence, at the termination of the first half-cycle; i.e., the first portion of signal from generator 14 wherein the signal is low, capacitor 26 is charged to a first positive voltage of approximately +E volts, which is greater than the supply voltage $+V_{cc}$. In the second half-cycle of output signal from generator 14 (when the waveform of FIG. 2*a* is high) transistor 16 is biased-off and transistor 46 is caused to conduct.

When transistor 46 is turned on, as in the second half-cycle of applied input signal, current begins to flow from capacitor 26 through transistor 46 to ground. This current flow causes the LC circuit comprised of inductor 22 and capacitor 26 to ring. The ringing continues until the voltage across capacitor 26 reaches a peak negative quantity. When the voltage across capacitor 26 reaches a peak negative value (see "C" in FIG. 2*b*), the current through inductor 22 reverses (see "D" of FIG. 2*c*) causing diode 24 to cease conducting and terminate current flow from capacitor 26. Hence, at the end of the second half-cycle of applied input signal, the voltage across capacitor 26 is a negative peak voltage of about −E volts. In a third half-cycle of applied input signal, transistor 16 again conducts causing the LC circuit of inductor 22 and capacitor 26 to ring. As the ringing occurs, the voltage across capacitor 26 changes from about −E volts to about +E volts, at which time the current through inductor 22 again reverses causing a cessation of current flow through diode 20 and retention of the +E volts across capacitor 26.

The peak voltage across capacitor 26 is further enhanced to an amount adequate for providing a desired amount of acoustic signal pressure at the output of transducer 26 by incorporating the mutual coupling of inductor 40 with inductor 22. Inductor 40 forms an LC circuit with capacitor 44 and is arranged to resonate at a higher frequency than the resonant frequency of inductor 22 and capacitor 26. When transistor 16 conducts, current flows from the source of supply voltage $V_{cc}$ through diode 38 to inductor 40. As with the charging and discharging of inductor 22 and capacitor 26, similar cyclic changes occur with respect to inductor 40 and capacitor 44. As current flows through diode 38, energy is induced from inductor 40 to inductor 22. The voltage increase across inductor 22 is in the approximate ratio of the turns between inductor 40 and inductor 22. To provide the desired peak-to-peak signal voltage across capacitor-transducer 26, the turns ratio of inductor 22 to inductor 40 may be selected, for example, about 50 to 1. By utilizing this turns ratio, the voltage across inductor 22 will be increased by approximately four times, resulting in an increased peak-to-peak voltage across capacitor 26.

Illustratively, when the apparatus of FIG. 1 is operated without inductor 40 and capacitor 44 in the circuit, the peak-to-peak voltage generated across capacitor 26 may be in the order of about 60 volts. This relatively high voltage, substantially in excess of two times $V_{cc}$ ($2 \times 9$ volts), is due to the relatively low impedance path between $V_{cc}$ and the LC circuit of inductor 22 and capacitor 26, and the relatively high Q of this LC circuit. Addition of inductor 40 and capacitor 44 to this circuit greatly enhances the voltage across capacitor 26 by increasing this voltage, for example, to about 250 volts peak-to-peak. Again, the relatively high Q of this second LC circuit of inductor 40 and capacitor 44 together with the relatively low impedance path supplying current thereto causes the voltage across inductor 40 to greatly increase over the 9-volt supply voltage. The energy transfer from inductor 40 to inductor 22 results in the significant voltage increase across capacitor 26 and a desired amount of signal voltage to this output transducer.

Thus, by using the above-described circuitry powered by a relatively low voltage battery source, signals may be generated for driving a capacitive transducer at a relatively high peak-to-peak voltage.

What is claimed is:

1. In an ultrasonic transmitter for generating ultrasonic frequency signals and having a capacitive type of output transducer, apparatus for providing signal energy to said transducer comprising:

an oscillator for generating ultrasonic frequency signals;

squaring means coupled to said oscillator for providing output signals having substantially first and second voltage states;

a first current conducting means coupled to said squaring means and responsive to signals of said first voltage state for providing current flow to said transducer;

a second current conducting means coupled to said squaring means and responsive to signals of said second voltage state for causing current flow from said transducer;

a first resonant circuit including at least a first inductor coupled between said transducer and said first and second current conducting means, said first inductor tuned with respect to the capacitance of said transducer to be resonant at a frequency greater than the highest frequency output provided by said oscillator; and a second resonant circuit including at least a second inductor coupled to said first and second current conducting means, said second inductor tuned to be resonant at a frequency greater than that of said first resonant circuit, said second inductor being magnetically coupled to said first inductor to increase signal voltage across said transducer.

2. Apparatus according to claim 1 including:

a first diode interposed between said first current conducting means and said first resonant circuit, in a direction for passing current from said current conducting means to said first resonant circuit; and a second diode interposed between said second current conducting means and said first resonant circuit, in a direction for carrying current away from said first resonant circuit.

3. Apparatus according to claim 2 including:

a third diode interposed between said first current conducting means and said second resonant circuit for passing current from said first current conducting means to said second resonant circuit; and a fourth diode interposed between said second current conducting means and said second resonant circuit for passing current from said second resonant circuit to said second current conducting means.

4. Apparatus according to claim 3 including:

a voltage multiplier responsive to said signals from said squaring means for providing a direct current, bias voltage to said transducer; and means bypassing said multiplier for passing signals from said squaring means to said transducer.

* * * * *